(12) United States Patent
Huang et al.

(10) Patent No.: US 9,869,914 B2
(45) Date of Patent: Jan. 16, 2018

(54) ARRAY SUBSTRATE AND DISPLAY DEVICE (71) Applicants: XIAMEN TIANMA MICRO-ELECTRONICS CO., LTD., Xiamen (CN); TIANMA MICRO-ELECTRONICS CO., LTD., Shenzhen (CN)

(72) Inventors: Wei Huang, Xiamen (CN); Qiang Shu, Xiamen (CN)

(73) Assignees: XIAMEN TIANMA MICRO-ELECTRONICS CO., LTD., Xiamen (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 35 days.

(21) Appl. No.: 14/731,428

(22) Filed: Jun. 5, 2015

(65) Prior Publication Data
US 2015/0355517 A1 Dec. 10, 2015

(30) Foreign Application Priority Data

Jun. 6, 2014 (CN) .......................... 2014 1 0249336

(51) Int. Cl.
*G02F 1/1335* (2006.01)
*G02F 1/1362* (2006.01)
*G02F 1/1368* (2006.01)
*H01L 27/12* (2006.01)

(52) U.S. Cl.
CPC ...... *G02F 1/136286* (2013.01); *G02F 1/1368* (2013.01); *H01L 27/1244* (2013.01); *H01L 27/1251* (2013.01); *G02F 2001/13629* (2013.01)

(58) Field of Classification Search
None
See application file for complete search history.

(56) References Cited

U.S. PATENT DOCUMENTS 9,171,520 B2 * 10/2015 Wu .......................... G09G 5/00
2010/0123868 A1 * 5/2010 Kim .................. G02F 1/136286
349/143

(Continued)

FOREIGN PATENT DOCUMENTS

CN 101762915 A 6/2010
CN 102955309 A 3/2013

(Continued)

OTHER PUBLICATIONS

An Office Action dated Mar. 30, 2016 in the CN counterpart application (201410249336.1).

*Primary Examiner* — Ali Naraghi
(74) *Attorney, Agent, or Firm* — Kilpatrick Townsend & Stockton LLP (57) ABSTRACT

The present disclosure discloses an array substrate and a display device so as to alleviate the toothed edge appearance when an image is displayed in a dual-gate array substrate structure. The array substrate includes at least one row of pixel elements, a first gate line, and a second gate line. The first gate line and the second gate line are disposed on the same side of the least one row of pixel elements. Thin film transistors are disposed in the pixel elements, and gates of the thin film transistors in two adjacent pixel elements are coupled with the first gate line and the second gate line, respectively.

18 Claims, 7 Drawing Sheets

(56) References Cited

U.S. PATENT DOCUMENTS

| 2011/0102309 | A1* | 5/2011 | Cho | G09G 3/3648 |
| | | | | 345/92 |
| 2011/0115782 | A1* | 5/2011 | Song | G09G 3/3659 |
| | | | | 345/213 |
| 2015/0325198 | A1* | 11/2015 | Chen | H01L 27/156 |
| | | | | 345/205 |

FOREIGN PATENT DOCUMENTS

| CN | 103187422 A | 7/2013 |
| WO | 2014023050 A1 | 2/2014 |

* cited by examiner

Fig.1

--Related art--

Fig.2

--Related art--

ARRAY SUBSTRATE AND DISPLAY DEVICE

CROSS REFERENCE TO RELATED APPLICATIONS

This application claims priority to Chinese patent application No. 201410249336.1, entitled "ARRAY SUBSTRATE AND DISPLAY DEVICE", filed with the State Intellectual Property Office of People's Republic of China on Jun. 6, 2014, the content of which is incorporated herein by reference in its entirety for all purposes.

BACKGROUND

Array substrates of Thin Film Transistor (TFT) Liquid Crystal Displays (LCD) utilize matrix driving modes, wherein the matrix is formed by rows of gate lines and columns of data lines which intersect with the gate lines, and TFTs are disposed in respective intersections so that each pixel electrode in the matrix of rows and columns is controlled by the TFTs. Provided that the resolution is unchanged, a dual-gate array substrate structure is typically utilized to reduce the number of data lines so as to lower the cost of a product.

In summary, a toothed edge may appear during display in the dual-gate array substrate structure in the related art, whereas the aperture ratio of the dual-gate array substrate structure shielded by a black matrix at the color filter substrate side in the related art is lower.

DETAILED DESCRIPTION

The present disclosure relates to the field of display technologies and specifically to array substrates and display devices. Embodiments of the present disclosure provide an array substrate and a display device so as to alleviate the toothed edge appearance when an image is displayed in a dual-gate array substrate structure.

Figure 1:
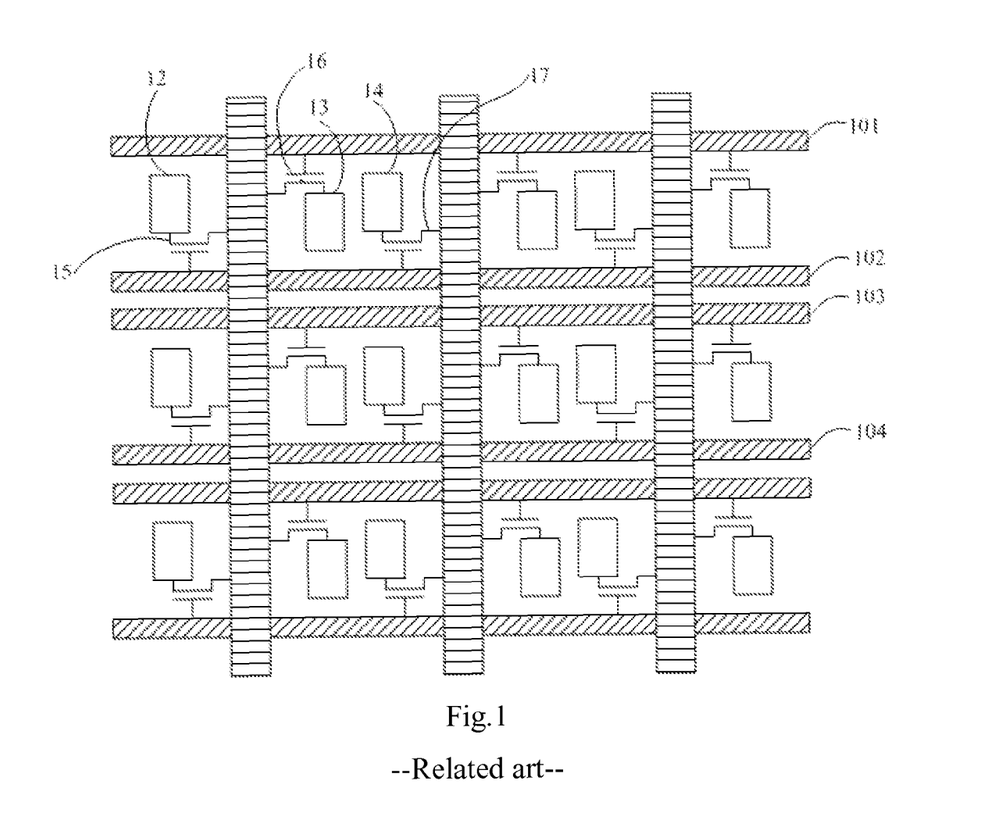
FIG. 1 is a schematic structural diagram of a dual-gate array substrate in the related art.

As illustrated in FIG. 1, due to the characteristics of a dual-gate structure itself, two gate lines are respectively located over and under a row of pixels. For example, a gate line 101 and a gate line 102 in the figure are respectively located over and under a first horizontal row of pixels, and a gate line 103 and a gate line 104 are respectively located over and under a second horizontal row of pixels. However, TFT elements need to be distributed following the wiring of gate lines, causing at present TFT element areas connected with two adjacent pixels in the same row are staggered up and down. For example, TFT element 15 and TFT element 16 are staggered up and down, and TFT element 16 and TFT element 17 are staggered up and down. Adjacent pixels connected with the TFT elements staggered up and down are also staggered up and down. For example, adjacent pixel 12 and pixel 13 are staggered up and down, and adjacent pixel 13 and pixel 14 are staggered up and down. Due to the up-and-down staggered configuration of adjacent pixels, light-transmitting areas of each pixel in the array substrate is asymmetric, thereby resulting in an appearance of a toothed edge of a displayed image.

Figure 2:
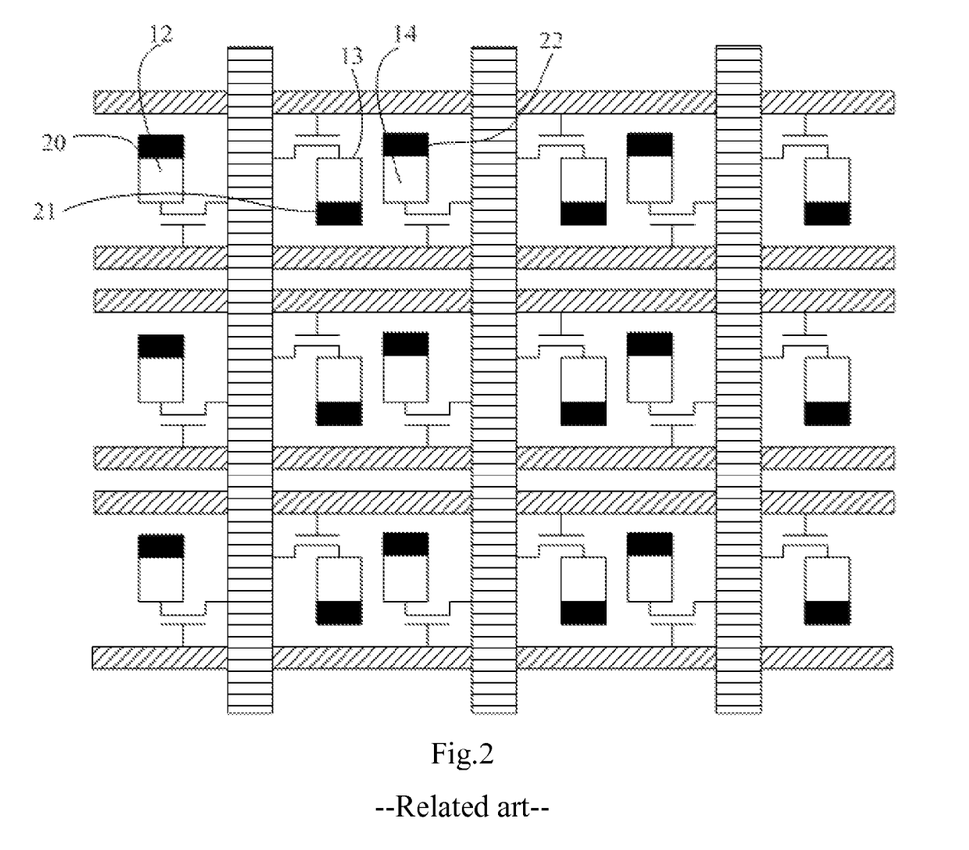
FIG. 2 is a schematic structural diagram of another dual-gate array substrate in the related art.

As illustrated in FIG. 2, in order to avoid the appearance of a toothed edge of an image, a Black Matrix (BM) at the color filter substrate side is utilized in the related art to shield protruding light-transmitting areas of a plurality of adjacent pixels in the same row. For example, protruding light-transmitting areas of the adjacent pixel 12 and pixel 13 are shielded respectively by black matrix 20, 21, and protruding light-transmitting areas of the adjacent pixel 13 and pixel 14 are shielded respectively by black matrix 21 and 22, thereby avoiding the appearance of a toothed edge of a displayed image, but reducing the aperture ratio.

Figure 3:
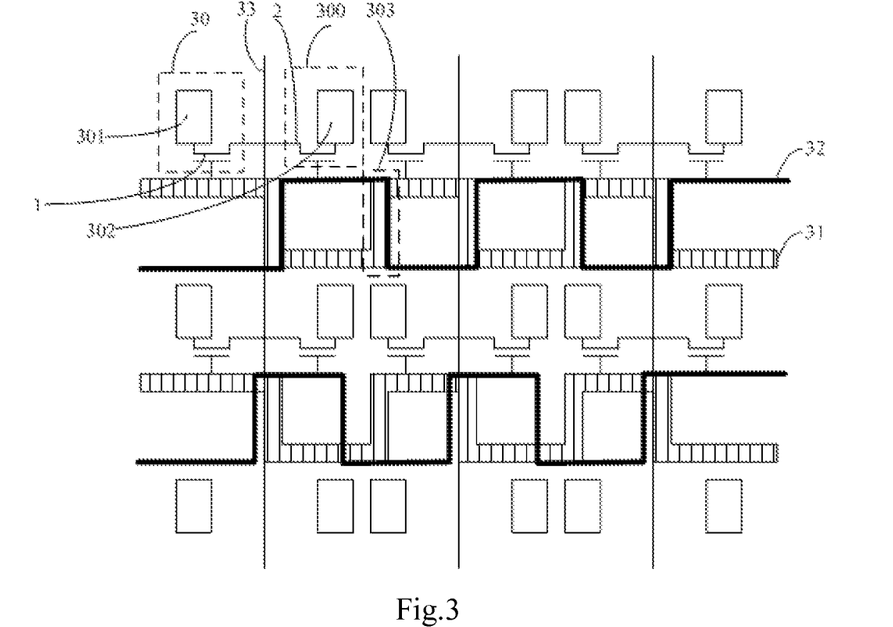
FIG. 3 is a schematic structural diagram of an array substrate according to an embodiment of the present disclosure.

As illustrated in FIG. 3, a specific embodiment of the present disclosure provides an array substrate including a plurality of pixel elements 30 and 300 disposed in the form of a matrix, wherein the pixel element 30 includes a pixel electrode 301 and a thin film transistor 1 connected with the pixel electrode 301, and the pixel element 300 includes a pixel electrode 302 and a thin film transistor 2 connected with the pixel electrode 302. A first gate line 31 and a second gate line 32 are disposed between two adjacent rows of pixel elements. The first gate line 31 and the second gate line 32 herein may extend horizontally or may extend vertically, and then the two adjacent rows of pixel elements may be adjacent horizontally or may be adjacent vertically, and the present disclosure will not be limited in this regard, although a horizontal row direction is taken as an example in the description of the specific embodiment of the present disclosure. Specifically, gates of the thin film transistors 1, 2 in the two pixel elements 30 and 300 adjacent in the row direction are connected respectively with the first gate line 31 and the second gate line 32, and source electrodes or drain electrodes of the thin film transistors 1, 2 are connected with the same data line 33.

It can be seen from FIG. 3 that the first gate line 31 and the second gate line 32 are disposed on the same side of the same horizontal row of pixel elements. Although TFT element areas, which are staggered up and down and connected with a plurality of adjacent pixel elements in the related art, may be disposed upright to alleviate the toothed edge appearance when an image is displayed in the dual-gate array substrate structure, then the first gate line 31 and the second gate line 32 may overlap. For example, the first gate line 31 and the second gate line 32 overlap in an area 303, resulting in short-circuit problems. Therefore, it is desirable to redesign the wiring of the first gate line 31 and the second gate line 32.

A wiring design of a first gate line and a second gate line in an array substrate according to specific embodiments of the present disclosure will be described in detail with reference to the drawings below.

Figure 4:
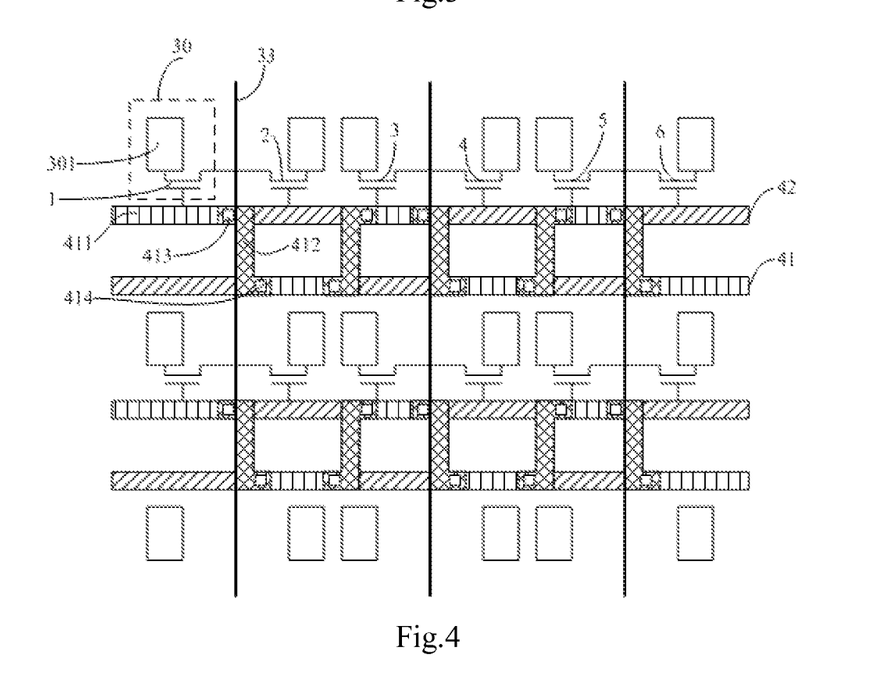
FIG. 4 is a schematic diagram of the wiring of first gate lines and second gate lines in an array substrate according to another embodiment of the present disclosure.

As illustrated in FIG. 4, one embodiment include a first gate line 41 and a second gate line 42. The first gate line 41 includes a plurality of metal patterns 411 and a plurality of jumper wires 412. The metal patterns 411 and the jumper wires 412 are located at different electrically conductive layers and insulated by an insulation layer. The second gate line 42 does not require jumper wire and is an integral gate line. Optionally, the metal patterns 411 are fabricated at the same layer of the second gate line 42.

Specifically, the insulation layer between the metal patterns 411 and the jumper wires 412 may be a singer-layer thin film or may be a multi-layer thin film, and the specific embodiment of the present disclosure will not be limited in this regard. There are a plurality of via holes in the insulation layer between the metal patterns 411 and the jumper wires 412, wherein the plurality of via holes herein are via holes etched out in the fabrication process of the array substrate to expose at least parts of two adjacent metal patterns 411 respectively, and the jumper wires 412 electrically connect the two adjacent metal patterns 411 through via holes 413, 414.

Specifically, in the first specific embodiment of the present disclosure, gates of thin film transistors in two horizontally adjacent pixel elements are connected respectively with the first gate line 41 and the second gate line 42. Optionally, gates of odd-numbered thin film transistors are connected with the first gate line 41: for example, gates of a first thin film transistor 1, a third thin film transistor 3 and a fifth thin film transistor 5 are connected with the first gate line 41; gates of even-numbered thin film transistors are connected with the second gate line 42: for example, gates of a second thin film transistor 2, a fourth thin film transistor 4 and a sixth thin film transistor 6 are connected with the second gate line 42. Naturally, herein the gates of the odd-numbered thin film transistors may be connected with the second gate line 42, and the gates of the even-numbered thin film transistors may be connected with the first gate line 41.

The thin film transistors in the first specific embodiment of the present disclosure may be of a top-gate structure or may be of a bottom-gate structure, and the specific embodiment of the present disclosure will not be limited to any specific type of thin film transistors. The thin film transistors in the first specific embodiment of the present disclosure include, from the bottom to the top, the gates, a gate insulation layer on the gates, a semiconductor active layer on the gate insulation layer, a first insulation layer, the source electrodes and the drain electrodes; or the semiconductor active layer, a second insulation layer on the semiconductor active layer, the gates on the second insulation layer, a third insulation layer on the gates, the source electrodes and the drain electrodes, in that order from the bottom to the top. The array substrate according to the first embodiment of the present disclosure further includes a fourth insulation layer on the thin film transistors and a pixel electrode layer on the fourth insulation layer. Second via holes are disposed in the fourth insulation layer, and the pixel electrodes are electrically connected with the source electrodes or the drain electrodes of the thin film transistors through the second via holes.

Optionally, the plurality of metal patterns 411 in the first gate line 41 are fabricated at the same layer as the gates of the thin film transistors; the second gate line 42 is fabricated at the same layer as the gates of the thin film transistors, in a one-step pattern forming process in specific fabrication processes to simplify the process and save the cost.

In a specific implementation, the metal patterns 411 may be fabricated at the same layer as the gates of the thin film transistors, or may be fabricated at the same layer as the source electrodes and the drain electrodes of the thin film transistors, or may be fabricated at the same layer as the pixel electrode layer, or naturally may be fabricated separately; the jumper wires 412 may be fabricated at the same layer as the gates of the thin film transistors, or may be fabricated at the same layer as the source electrodes and the drain electrodes of the thin film transistors, or may be fabricated at the same layer as the pixel electrode layer, or naturally may be fabricated separately, as long as it is ensured that the metal patterns 411 and the jumper wires 412 are located at different electrically conductive layers and to be insulated by the insulation layer. Similarly, the second gate line 42 may also be fabricated at the same layer as the gates of the thin film transistors, or as the source electrodes and the drain electrodes of the thin film transistor, or as the pixel electrode layer, or naturally may be fabricated separately.

Moreover, in the first specific embodiment of the present disclosure, when the metal patterns 411 or the jumper wires 412 in the first gate line 41 are not fabricated at the same layer as the gates of the thin film transistors, connection lines further need to be fabricated in specific fabrication processes to connect the gates of the thin film transistors with the first gate line 41, wherein the connection lines may be fabricated through etching via holes in the fabrication process of the array substrate. Similarly, when the second gate line 42 is not fabricated at same layer as the gates of the thin film transistors, connection lines also need to be fabricated in specific fabrication processes to connect the gates of the thin film transistors with the second gate line 42, wherein the connection lines may be fabricated through etching via holes in the fabrication process of the array substrate.

Figure 5:
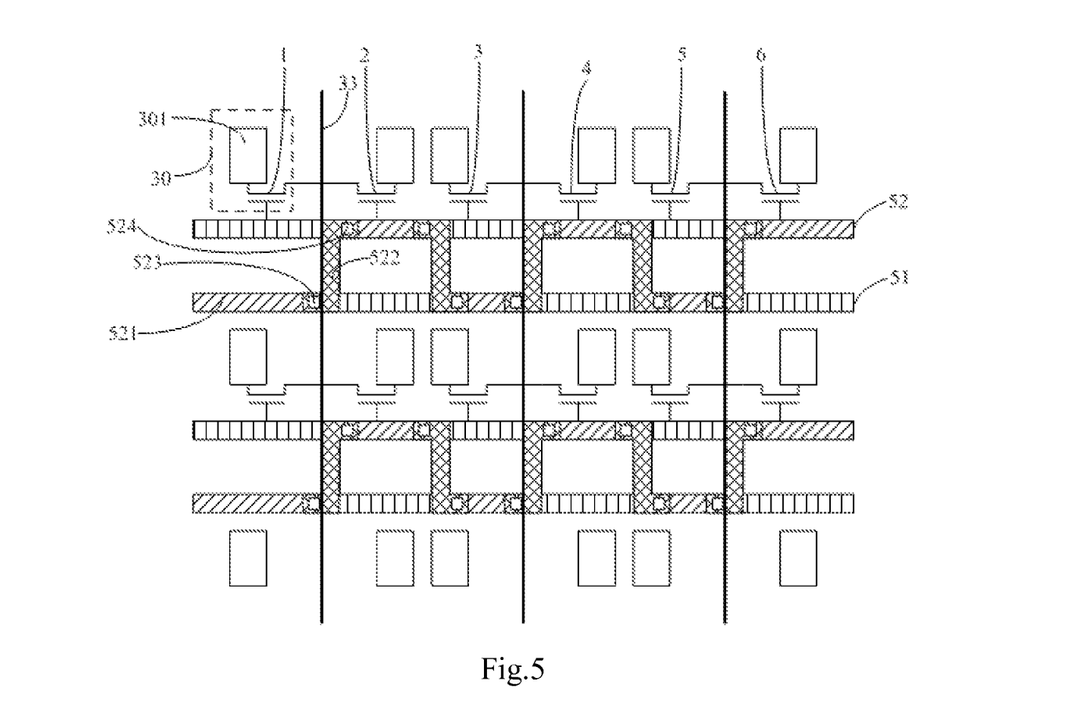
FIG. 5 is a schematic diagram of the wiring of first gate lines and second gate lines in an array substrate according to another embodiment of the present disclosure.

As illustrated in FIG. 5, another embodiment includes a first gate line 51 and a second gate line 52. The second gate line 52 includes a plurality of metal patterns 521 and a plurality of jumper wires 522. The metal patterns 521 and the jumper wires 522 are located at different electrically conductive layers and insulated by an insulation layer. The first gate line 51 does not require jumper wire and is an integral gate line. Optionally, the metal patterns 521 are fabricated at the same layer of the first gate line 51.

Specifically, the insulation layer between the metal patterns 521 and the jumper wires 522 may be a singer-layer thin film, or may be a multi-layer thin film, and the specific embodiment of the present disclosure will not be limited in this regard. There are a plurality of via holes in the insulation layer between the metal patterns 521 and the jumper wires 522, wherein the plurality of via holes herein are via holes etched out in the fabrication process of the array substrate to expose at least parts of two adjacent metal patterns 521 respectively, and the jumper wires 522 electrically connect the two adjacent metal patterns 521 through via holes 523, 524.

Specifically, in the second specific embodiment of the present disclosure, gates of thin film transistors in two horizontally adjacent pixel elements are connected respectively with the first gate line 51 and the second gate line 52. Optionally, gates of odd-numbered thin film transistors are connected with the first gate line 51: for example, gates of a first thin film transistor 1, a third thin film transistor 3, and a fifth thin film transistor 5 are connected with the first gate line 51; and gates of even-numbered thin film transistors are connected with the second gate line 52: for example, gates of a second thin film transistor 2, a forth thin film transistor 4, and a sixth thin film transistor 6 are connected with the second gate line 52. Naturally, herein the gates of the odd-numbered thin film transistors may be connected with the second gate line 52, and the gates of the even-numbered thin film transistors may be connected with the first gate line 51.

The thin film transistors in the second specific embodiment of the present disclosure may be of a top-gate structure or may be of a bottom-gate structure, and the specific embodiment of the present disclosure will not be limited to any specific type of thin film transistors. Optionally, the thin film transistors in the second specific embodiment of the present disclosure include, from the bottom to the top, the gates, a gate insulation layer on the gates, a semiconductor active layer on the gate insulation layer, a first insulation layer, the source electrodes and the drain electrodes; or the semiconductor active layer, a second insulation layer on the semiconductor active layer, the gates on the second insulation layer, a third insulation layer on the gates, the source electrodes and the drain electrodes. The array substrate according to the second embodiment of the present disclosure further includes a fourth insulation layer on the thin film transistors and a pixel electrode layer on the fourth insulation layer. Second via holes are disposed in the fourth insulation layer, and the pixel electrodes are electrically connected with the source electrodes or the drain electrodes of the thin film transistors through the second via holes.

Optionally, the plurality of metal patterns 521 in the second gate line 52 are fabricated at the same layer as the gates of the thin film transistors; the first gate line 51 is fabricated at the same layer as the gates of the thin film transistors, in a one-step pattern forming process in specific fabrication processes to simplify the process and save the cost.

In a specific implementation, the metal patterns 521 may be fabricated at the same layer as the gates of the thin film transistors, or may be fabricated at the same layer as the source electrodes and the drain electrodes of the thin film transistors, or may be fabricated at the same layer as the pixel electrode layer, or naturally may be fabricated separately; the jumper wires 522 may be fabricated at the same layer as the gates of the thin film transistors, or may be fabricated at the same layer as the source electrodes and the drain electrodes of the thin film transistors, or may be fabricated at the same layer as the pixel electrode layer, or naturally may be fabricated separately, as long as it is ensured that the metal patterns 521 and the jumper wires 522 are located at different electrically conductive layers and to be insulated by the insulation layer. Similarly, the first gate line 51 may also be fabricated at the same layer as the gates of the thin film transistors, or as the source electrodes and the drain electrodes of the thin film transistor, or as the pixel electrode layer, or naturally may be fabricated separately.

Moreover, in the second specific embodiment of the present disclosure, when the metal patterns 521 or the jumper wires 522 in the second gate line 52 are not fabricated at same layer as the gates of the thin film transistors, connection lines further need to be fabricated in a specific fabrication process to connect the gates of the thin film transistors with the second gate line 52, wherein the connection lines may be fabricated through via holes etching in fabrication process of the array substrate. Similarly, when the first gate line 51 is not fabricated at same layer as the gates of the thin film transistors, connection lines also need to be fabricated in specific fabrication processes to connect the gates of the thin film transistors with the first gate line 51, wherein the connection lines may be fabricated through etching via holes in the fabrication process of the array substrate.

Figure 6:
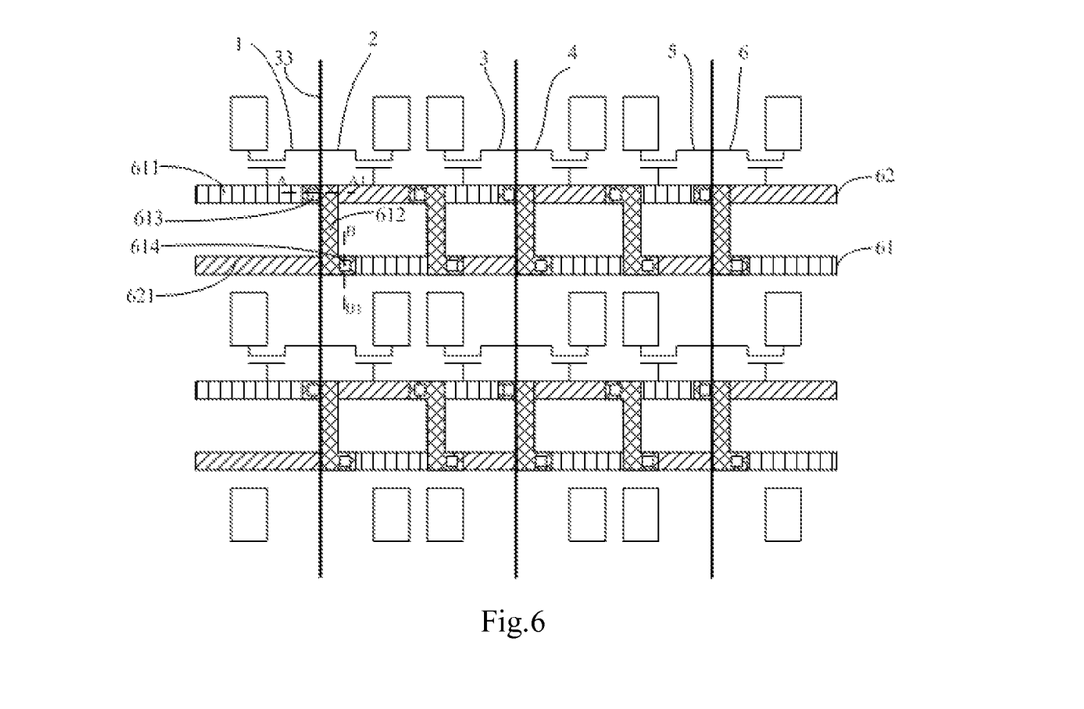
FIG. 6 is a schematic diagram of the wiring of first gate lines and second gate lines in an array substrate according to another embodiment of the present disclosure.

As illustrated in FIG. 6, another embodiment includes a first gate line 61 and a second gate line 62. The first gate line 61 includes a plurality of first metal patterns 611 and a plurality of first jumper wires 612. The first metal patterns 611 and the first jumper wires 612 are located at different electrically conductive layers and insulated by an insulation layer; the second gate line 62 includes a plurality of second metal patterns 621 and a plurality of second jumper wires (not shown in the figure), wherein the second metal patterns 621 and the second jumper wires are located at different electrically conductive layers and insulated by an insulation layer.

Specifically, the insulation layer between the first metal patterns 611 and the first jumper wires 612 may be a singer-layer thin film or may be a multi-layer thin film, and the specific embodiment of the present disclosure will not be limited in this regard. There are a plurality of via holes in the insulation layer between the first metal patterns 611 and the first jumper wires 612, wherein the plurality of via holes herein are first via holes etched out in the fabrication process of the array substrate to expose at least parts of two adjacent first metal patterns 611 respectively, and the first jumper wires 612 electrically connect the two adjacent first metal patterns 611 through via holes 613, 614.

Specifically, the insulation layer between the second metal patterns 621 and the second jumper wires may be a singer-layer thin film or may be a multi-layer thin film, and the specific embodiment of the present disclosure will not be limited in this regard. There are a plurality of via holes in the insulation layer between the second metal patterns 621 and the second jumper wires, wherein the plurality of via holes here are first via holes etched out in the fabrication process of the array substrate to expose at least parts of two adjacent second metal patterns 621 respectively, and the second jumper wires electrically connect the two adjacent second metal patterns 621 through the via holes.

Both the first gate line 61 and the second gate 62 are constituted of two layers of metal. Optionally, the first metal patterns 611 and the second metal patterns 621 are located at the same layer, and the first jumper wires 621 and the second jumper wires are located at the same layer; or naturally the first metal patterns 611 and the second jumper wires may be located at the same layer, and the second metal patterns 621 and the first jumper wires 612 may be located at the same layer, and the specific embodiment of the present disclosure will not be limited to any specific arrangement thereof.

The thin film transistors in the third specific embodiment of the present disclosure may be of a top-gate structure or may be of a bottom-gate structure, and the specific embodiment of the present disclosure will not be limited to any specific type of thin film transistors. Optionally, the thin film transistors in the third specific embodiment of the present disclosure include, from the bottom to the top, the gates, a gate insulation layer on the gates, a semiconductor active layer on the gate insulation layer, a first insulation layer, the source electrodes and the drain electrodes; or the semiconductor active layer, a second insulation layer on the semiconductor active layer, the gates on the second insulation layer, a third insulation layer on the gates, the source electrodes and the drain electrodes. The array substrate according to the third embodiment of the present disclosure further includes a fourth insulation layer on the thin film transistors and a pixel electrode layer on the fourth insulation layer, wherein second via holes are disposed in the fourth insulation layer, and the pixel electrodes are electrically connected with the source electrodes or the drain electrodes of the thin film transistors through the second via holes.

In a specific implementation, the first metal patterns 611 may be fabricated at the same layer as the gates of the thin film transistors, or may be fabricated at the same layer as the source electrodes and the drain electrodes of the thin film transistors, or may be fabricated at the same layer as the pixel electrode layer, or naturally may be fabricated separately; the second metal patterns 621 may be fabricated at the same layer as the gates of the thin film transistors, or may be fabricated at the same layer as the source electrodes and the drain electrodes of the thin film transistors, or may be fabricated at the same layer as the pixel electrode layer, or naturally may be fabricated separately; the first jumper wires 612 may be fabricated at the same layer as the gates of the thin film transistors, or may be fabricated at the same layer as the source electrodes and the drain electrodes of the thin film transistors, or may be fabricated at the same layer as the pixel electrode layer, or naturally may be fabricated separately; the second jumper wires may be fabricated at the same layer as the gates of the thin film transistors, or may be fabricated at the same layer as the source electrodes and the drain electrodes of the thin film transistors, or may be fabricated at the same layer as the pixel electrode layer, or naturally may be fabricated separately. In the third specific embodiment of the present disclosure, the first metal patterns 611, the second metal patterns 621, the first jumper wires 612 and the second jumper wires may be disposed in numerous combinations during fabrication as long as it is ensured that the first metal patterns 611 and the first jumper wires 612 are located at different electrically conductive layers and to be insulated by the insulation layer, and the second metal patterns 621 and the second jumper wires are located at different electrically conductive layers and to be insulated by the insulation layer. The third specific embodiment of the present disclosure will not be limited to any specific arrangement thereof.

Moreover, in the third specific embodiment of the present disclosure, when the first metal patterns 611 or the first jumper wires 612 in the first gate line 61 are not fabricated at same layer as the gates of the thin film transistors, connection lines further need to be fabricated in specific fabrication processes to connect the gates of the thin film transistors with the first gate line 61, wherein the connection lines may be fabricated through etching via holes in the fabrication process of the array substrate. Similarly, when the second metal patterns 621 or the second jumper wires of the second gate line 62 are not fabricated at same layer as the gates of the thin film transistors, connection lines further need to be fabricated in specific fabrication processes to connect the gates of the thin film transistors with the second gate line 62, wherein the connection lines may be fabricated through etching via holes in the fabrication process of the array substrate.

Optionally, the number of the first metal patterns 611 is the same as the number of the second metal patterns 621, and the number of the first jumper wires 612 is the same as the number of the second jumper wires. As illustrated in FIG. 6, gates of thin film transistors in odd-numbered pixel elements in the same direction as the first gate line 61 are connected with the first gate line 61: for example, gates of a first thin film transistor 1, a third thin film transistor 3, and a fifth thin film transistor 5 are connected with the first gate line 61; gates of thin film transistors in even-numbered pixel elements in the same direction as the second gate line 62 are connected with the second gate line 62: for example, gates of a second thin film transistor 2, a fourth thin film transistor 4, and a sixth thin film transistor 6 are connected with the second gate line 62. Naturally, herein the gates of the thin film transistors in the odd-numbered pixel elements in the same direction as the second gate line 62 may be connected with the second gate line 62, and the gates of the thin film transistors in the even-numbered pixel elements in the same direction as the first gate line 61 may be connected with the first gate line 61.

Figure 7:
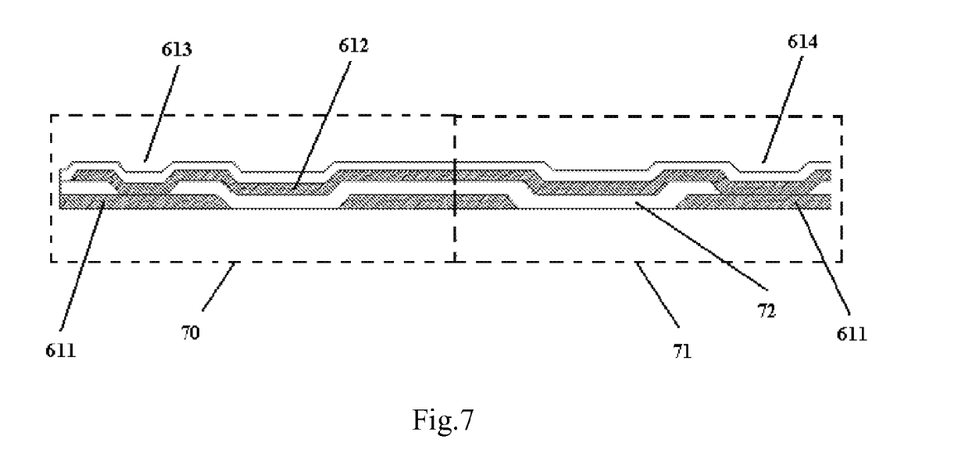
FIG. 7 is schematic cross-sectional views in the AA1 direction and the BB1 direction in FIG. 6.

FIG. 7 illustrates schematic cross-sectional views in the AA1 direction and the BB1 direction in FIG. 6, wherein in FIG. 7, the section 70 represents the cross-sectional view in the AA1 direction, and the section 71 represents the cross-sectional view in the BB1 direction. The first metal patterns 611 and the first jumper wires 612 of the first gate line are located at different electrically conductive layers and insulated by the insulation layer 72, wherein the first metal patterns 611 are spaced from each other. There are a plurality of via holes in the insulation layer 72 to expose at least parts of two adjacent first metal patterns 611 respectively at the position of the via holes, and the first jumper wires 612 electrically connect the two adjacent first metal patterns 611 through via holes 613 and 614.

Figure 8:
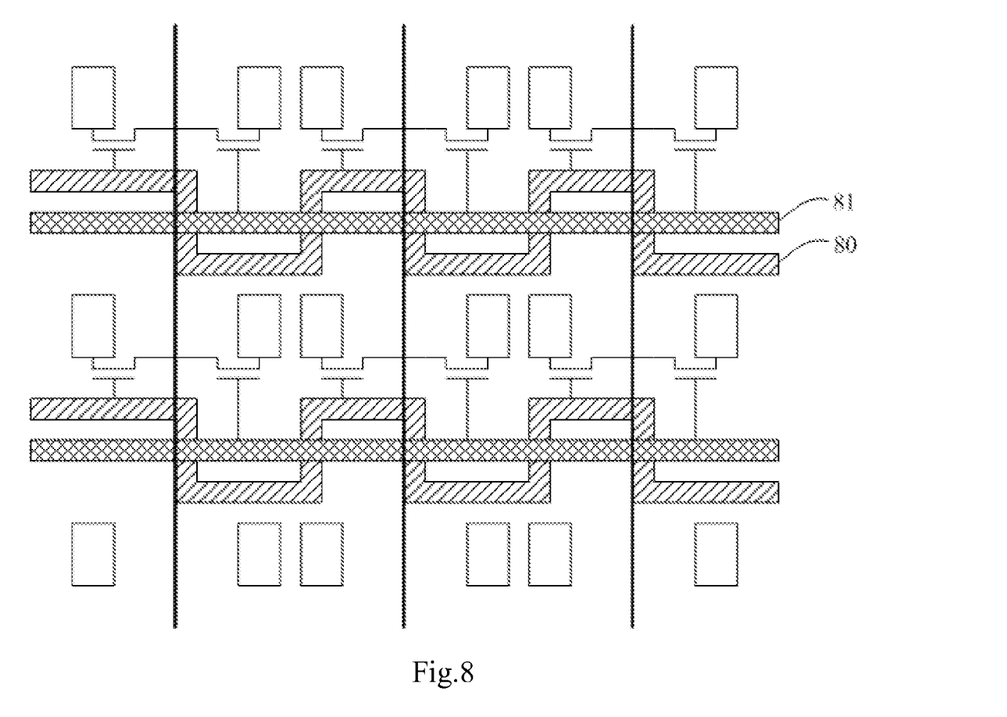
FIG. 8 is a schematic diagram of the wiring of first gate lines and second gate lines in an array substrate according to another embodiment of the present disclosure.

As illustrated in FIG. 8, during the process of fabricating an array substrate according to the fourth specific embodiment of the present disclosure, a first gate line 80 or a second gate line 81 may be fabricated on different electrically conductive layers, and then no jumper wires need to be fabricated for either the first gate line 80 or the second gate line 81.

Optionally, the array substrate according to the specific embodiment of the present disclosure further includes a pixel electrode layer. The first gate line 80 or the second gate line 81 is fabricated at the same layer as the pixel electrode layer. The pixel electrode layer herein may be an electrically conductive layer of metal or may be an electrically conductive layer of Indium Tin Oxide (ITO).

Specifically the first gate line 80 in the fourth specific embodiment of the present disclosure may be fabricated at the same layer as the pixel electrode layer, or as same layer as the gates of the thin film transistors, or the source electrode and drain electrode layers of the thin film transistors; or naturally, an electrically conductive layer may be fabricated separately in specific fabrication processes. However, when the first gate line 80 is not fabricated at same layer as the gates of the thin film transistors, connection lines further need to be fabricated in specific fabrication processes to connect the gates of the thin film transistors with the first gate line 80, wherein the connection lines may be fabricated through etching via holes in the fabrication process of the array substrate. Similarly, the second gate line 81 may be fabricated at the same layer as the pixel electrode layer, or as same layer as the gates of the thin film transistors or the source electrode and drain electrode layers of the thin film transistors; or naturally, an electrically conductive layer may be fabricated separately in specific fabrication processes as long as it is ensured that the first gate line 80 and the second gate line 81 are located on different electrically conductive layers and to be insulated by the insulation layer. Similarly when the second gate line 81 is not fabricated at same layer as the gates of the thin film transistors, connection lines further need to be fabricated in specific fabrication processes to connect the gates of the thin film transistors with the second gate line 81, wherein the connection lines may be fabricated through etching via holes in the fabrication process of the array substrate.

In the embodiments of the present disclosure, the same data line is shared by the source electrodes or the drain electrodes of the thin film transistors in two pixel elements adjacent in the row direction. Wiring conditions of data lines in the first to fourth specific embodiments of the present disclosure will be described below briefly with reference to the drawings.

Figure 9:
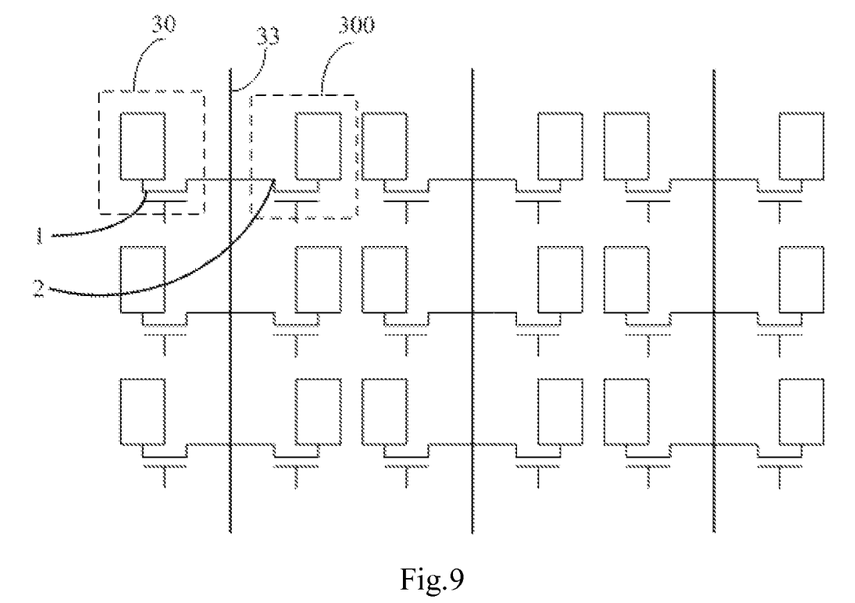
FIG. 9 is a schematic diagram of one wiring configuration of data lines in an array substrate according to an embodiment of the present disclosure.

FIG. 9 illustrates a wiring design of data lines in the specific embodiments of the present disclosure. The source electrodes or the drain electrodes of the thin film transistors 1 and 2 in the two pixel elements 30 and 300 adjacent in the row direction are connected with the same data line 33. The wiring design of the gate lines connected with the respective thin film transistors in the figure is the same as any of the wiring designs of the gate lines in the first to fourth specific embodiments of the present disclosure although the former is not specifically illustrated in FIG. 9. Since the same data line 33 is shared by the thin film transistors 1 and 2, the number of data lines may be reduced.

Figure 10:
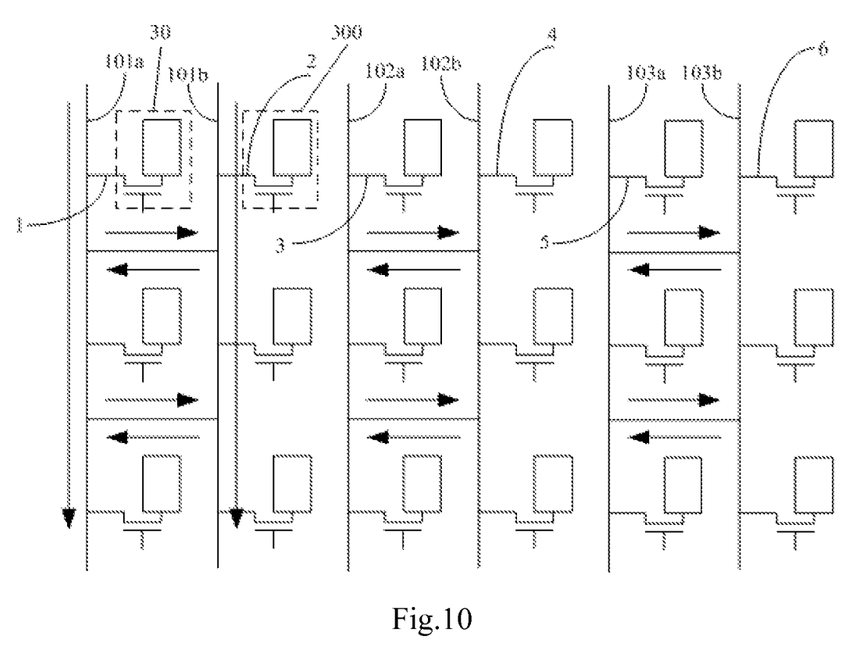
FIG. 10 is a schematic diagram of another wiring configuration of data lines in an array substrate according to an embodiment of the present disclosure.

FIG. 10 illustrates another wiring design of data lines in the specific embodiments of the present disclosure. In the specific embodiments of the present disclosure, the source electrodes or the drain electrodes of the thin film transistors 1 and 2 in the two pixel elements 30 and 300 adjacent in the row direction are connected respectively with data lines 101*a* and 101*b*. Wiring design of the gate lines connected with the respective thin film transistors in the figure is the same as any of the wiring designs of the gate lines in the first to fourth specific embodiments of the present disclosure although the former is not specifically illustrated in FIG. 10. The arrows in the figure represent the directions in which a data signal input on a data line travels. The input data signal is the same on the data lines 101*a* and 101*b* connected respectively with the source electrodes or the drain electrodes of the thin film transistors 1 and 2; the input data signal is the same on data lines 102*a* and 102*b* connected respectively with source electrodes or drain electrodes of thin film transistors 3 and 4; and the input data signal is the same on data lines 103*a* and 103*b* connected respectively with source electrodes or drain electrodes of thin film transistors 5 and 6.

Specifically, since the input data signal is the same on the data lines 101*a* and 101*b*, the data lines connected respectively with the source electrodes or the drain electrodes of the thin film transistors 1 and 2 may be considered as the same data line. A horizontal arrow represents a common data signal on the data lines connected with the source electrodes or the drain electrodes of the thin film transistors 1 and 2. Although the number of data lines connected with the source electrodes or the drain electrodes of the thin film transistors 1 and 2 is not reduced in the pixel area of the array substrate, the number of connection lines connected with a drive circuit will be reduced.

A process of fabricating the array substrate in the specific embodiments of the present disclosure will be described below briefly. The actual fabrication process may vary depending on different wiring designs of gate lines and wiring designs of data lines, and one of the fabrication processes will be described below briefly.

Firstly, a first layer of metal is deposited and etched on a glass substrate. The first layer of metal may be a single layer of metal or may be composite metal. The deposited and etched first layer of metal may be the gates of the thin film transistor, or may be the first gate line, the metal patterns in the first gate line, or the jumper wires in the first gate line; or may be the second gate line, the metal patterns in the second gate line, or the jumper wires in the second gate line.

A first insulation layer is deposited and etched after the fabrication process of the first layer of metal to form first via holes for line switching of a first gate line or a second gate line. For example, in the specific embodiments of the present disclosure, when the first gate line includes the plurality of first metal patterns and the plurality of first jumper wires, the first metal patterns and the first jumper wires are located on different electrically conductive layers and insulated by the first insulation layer. There are a plurality of first via holes in the first insulation layer to expose at least parts of two adjacent first metal patterns respectively. The first jumper wires electrically connect the two adjacent first metal patterns via the first via holes to achieve the line switching of the first gate line.

A-Si and n+ a-Si thin films are deposited and etched after the fabrication process of the first insulation layer. The etched a-Si and n+ a-Si thin films are the semiconductor active layer of the thin film transistors.

A second layer of metal is deposited and etched after the fabrication process of the a-Si and n+ a-Si thin films. Similarly, the second layer of metal may be a single layer of metal or may be composite metal. The deposited and etched second layer of metal may be the source electrodes and the drain electrodes of the thin film transistor; or may be the first gate line, the metal patterns in the first gate line, or the jumper wires in the first gate line, or may be the second gate line, the metal patterns in the second gate line, or the jumper wires in the second gate line.

A second insulation layer is deposited and etched after the fabrication process of the second layer of metal to form second via holes through which a pixel electrode layer to be deposited later is connected with the source electrodes or the drain electrodes of the thin film transistors.

The transparent pixel electrode layer is deposited and etched after the fabrication process of the second insulation layer. The deposited and etched transparent pixel electrode layer may be the pixel electrodes of the array substrate; or may be the first gate line, the metal patterns in the first gate line, or the jumper wires in the first gate line, or may be the second gate line, the metal patterns in the second gate line, or the jumper wires in the second gate line. Optionally, the transparent pixel electrode layer in the specific embodiments of the present disclosure is ITO.

Moreover, the process of fabricating the array substrate in the specific embodiments of the present disclosure will be equally applicable to a Low Temperature Poly-Silicon (LTPS) process.

The pixel elements of the at least one row of the pixel elements may substantially align with each other along the extension of the at least one row of the pixel elements.

The plurality of the metal patterns may include a plurality of first metal patterns and a plurality of second metal patterns, the plurality of the first metal patterns align with each other along a first longitudinal extension thereof, the plurality of the second metal patterns align with each other along a second longitudinal extension thereof, the first longitudinal extension is parallel to the second longitudinal extension, and each of the plurality of the jumper wires electrically couples one of the plurality of the first metal patterns and one of the plurality of the second metal patterns.

The plurality of the first metal patterns may substantially align with at least portions of the second gate line along the first longitudinal extension.

The plurality of the jumper wires may substantially align longitudinally with at least portions of the second gate line.

The common data line may be disposed between the two adjacent pixel elements.

The common data line may include a first data line and a second data line disposed on either side of one of the two adjacent pixel elements, and the first data line and the second data line are in electrical communication with each other and receive same input signal.

Alternatively, at least one of the first gate line or the second gate line is an integral and/or continuous gate line.

The first gate line may extend along a first longitudinal extension, the second gate line may include a plurality of first portions extending along a second longitudinal extension and a plurality of second portions extending along a third longitudinal extension, the second longitudinal extension and the third longitudinal extension are parallel to the first longitudinal extension and on either side of the first longitudinal extension.

Figure 11:
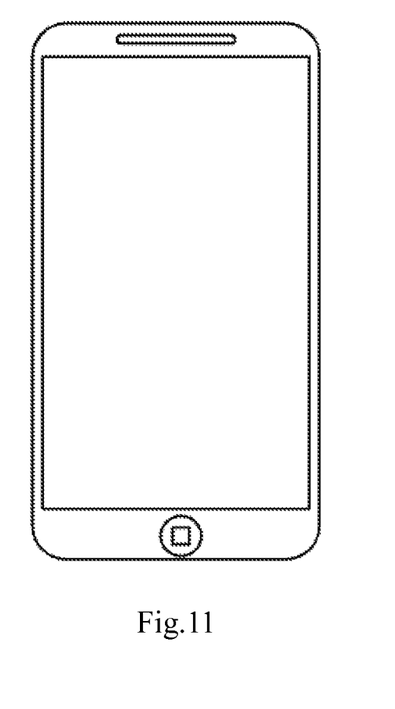
FIG. 11 is a schematic structural diagram of a display device according to an embodiment of the present disclosure.

A specific embodiment of the present disclosure further provides a display device which may specifically be a handset illustrated in FIG. 11, or naturally may be another type of display devices, e.g., a liquid crystal television. The display device according to the specific embodiment of the present disclosure includes the array substrate as described above.

Evidently, those skilled in the art may make various modifications and variations to the present disclosure without departing from the spirit and scope of the present disclosure. Therefore, the present disclosure is also intended to encompass these modifications and variations thereto so long as the modifications and variations fall within the scope of the claims appended to the present disclosure and their equivalents.

The invention claimed is:

1. An array substrate for a display device, the array substrate comprising: at least one row of pixel elements, wherein each pixel element comprises a thin film transistor having a gate; a first gate line and a second gate line disposed on the same side of the at least one row of pixel elements, wherein the gates of the thin film transistors in two adjacent pixel elements in one row are coupled with the first gate line and the second gate line, respectively; and a plurality of data lines, wherein each of the thin film transistors comprises a source electrode and a drain electrode, the source electrodes or the drain electrodes of the thin film transistors in two adjacent pixel elements share one common data line of the plurality of the data lines; wherein one of the first gate line and the second gate line comprises a plurality of metal patterns and a plurality of jumper wires, and the plurality of the metal patterns and the plurality of the jumper wires are located at different electrically conductive layers and insulated by an insulation layer, the insulation layer comprises a plurality of via holes exposing at least a portion of each of the plurality of the metal patterns, and each of the plurality of the jumper wires electrically couples the plurality of the metal patterns through the plurality of the via holes.

2. The array substrate according to claim 1, wherein the pixel elements of the at least one row of the pixel elements substantially align with each other along the extension of the at least one row of the pixel elements.

3. The array substrate according to claim 1, wherein the thin film transistors comprise:

an gate insulation layer on the gates, a semiconductor active layer on the gate insulation layer, a first insulation layer on the semiconductor active layer, and source electrodes and drain electrodes on the first insulation layer; or the semiconductor active layer, a second insulation layer on the semiconductor active layer, gates on the second insulation layer, a third insulation layer on the gates, and source electrodes and drain electrodes on the third insulation layer.

4. The array substrate according to claim 3, wherein the array substrate further comprises a pixel electrode layer, and the first gate line or the second gate line is fabricated at the same layer as the pixel electrode layer or as a gate layer of the thin film transistors or as source electrode and the drain electrode layers of the thin film transistors.

5. The array substrate according to claim 1, wherein the first gate line comprises a plurality of first metal patterns and a plurality of first jumper wires, the plurality of the first metal patterns and the plurality of the first jumper wires are located at different electrically conductive layers and insulated by a first insulation layer, the first insulation layer comprises a plurality of first via holes exposing at least a portion of each of the plurality of the first metal patterns, and the plurality of the first jumper wires electrically couple the plurality of the first metal patterns through the plurality of the first via holes; and the second gate line comprises a plurality of second metal patterns and a plurality of second jumper wires, the plurality of the second metal patterns and the plurality of the second jumper wires are located at different electrically conductive layers and insulated by a second insulation layer, the second insulation layer comprises a plurality of second via holes exposing at least a portion of each of the plurality of the second metal patterns, and the plurality of the second jumper wires electrically couple the plurality of the second metal patterns through the plurality of the second via holes.

6. The array substrate according to claim 5, wherein the array substrate further comprises connection lines connecting the gates of the thin film transistor with the first gate line or the second gate line when the first gate line and/or the second gate line is not disposed at the same layer as a gate layer of the thin film transistors.

7. The array substrate according to claim 5, wherein the plurality of the first metal patterns, the plurality of the first jumper wires, the plurality of the second metal patterns, or the plurality of the second jumper wires are formed by the same layer of metal as the gates of the thin film transistors.

8. The array substrate according to claim 6, wherein the first gate line is coupled with the gates of the thin film transistors in the odd-numbered pixel elements in the at least one row of the pixel elements; and the second gate line is coupled with the gates of the thin film transistors in the even-numbered pixel elements in the at least one row of the pixel elements.

9. The array substrate according to claim 1, wherein the plurality of the metal patterns are located at the same layer as the other of the first gate line and the second gate line.

10. The array substrate according to claim 1, wherein the plurality of the metal patterns comprises a plurality of first metal patterns and a plurality of second metal patterns, the plurality of the first metal patterns align with each other along a first longitudinal extension thereof, the plurality of the second metal patterns align with each other along a second longitudinal extension thereof, the first longitudinal extension is parallel to the second longitudinal extension, and each of the plurality of the jumper wires electrically couples one of the plurality of the first metal patterns and one of the plurality of the second metal patterns.

11. The array substrate according to claim 10, wherein the plurality of the first metal patterns substantially align with at least portions of the second gate line along the first longitudinal extension.

12. The array substrate according to claim 10, wherein the plurality of the jumper wires substantially align longitudinally with at least portions of the second gate line.

13. The array substrate according to claim 1, wherein the metal patterns or the jumper wires are the same layer of metal as the gates of the thin film transistors.

14. The array substrate according to claim 1, wherein the common data line is disposed between the two adjacent pixel elements.

15. The array substrate according to claim 14, wherein the common data line comprises a first data line and a second data line disposed on either side of one of the two adjacent pixel elements, and the first data line and the second data line are in electrical communication with each other and receive same input signal.

16. The array substrate according to claim 1, wherein at least one of the first gate line or the second gate line is an integral and/or continuous gate line.

17. The array substrate according to claim 16, wherein the first gate line extends along a first longitudinal extension, the second gate line comprises a plurality of first portions extending along a second longitudinal extension and a plurality of second portions extending along a third longitudinal extension, the second longitudinal extension and the third longitudinal extension are parallel to the first longitudinal extension and on either side of the first longitudinal extension.

18. A display device, comprising an array substrate, the array substrate comprising: at least one row of pixel elements, wherein each pixel element comprises a thin film transistor having a gate; a first gate line and a second gate line disposed on the same side of the at least one row of pixel elements; wherein the gates of the thin film transistors in two adjacent pixel elements are coupled with the first gate line and the second gate line, respectively; and a plurality of data lines, wherein each of the thin film transistors comprises a source electrode and a drain electrode, the source electrodes or the drain electrodes of the thin film transistors in two adjacent pixel elements share one common data line of the plurality of the data lines; wherein one of the first gate line and the second gate line comprises a plurality of metal patterns and a plurality of jumper wires, and the plurality of the metal patterns and the plurality of the jumper wires are located at different electrically conductive layers and insulated by an insulation layer, the insulation layer comprises a plurality of via holes exposing at least a portion of each of the plurality of the metal patterns, and each of the plurality of the jumper wires electrically couples the plurality of the metal patterns through the plurality of the via holes.

* * * * *